(12) United States Patent
Hendriks et al.

(10) Patent No.: US 7,148,103 B2
(45) Date of Patent: Dec. 12, 2006

(54) MULTILEVEL POLY-SI TILING FOR SEMICONDUCTOR CIRCUIT MANUFACTURE

(75) Inventors: Antonius Maria Petrus Johannes Hendriks, Nijmegen (NL); Guido Jozef Maria Dormans, Nijmegen (NL); Robertus Dominicus Joseph Verhaar, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 142 days.

(21) Appl. No.: 10/492,888

(22) PCT Filed: Oct. 16, 2002

(86) PCT No.: PCT/IB02/04357

§ 371 (c)(1),
(2), (4) Date: Apr. 16, 2004

(87) PCT Pub. No.: WO03/034485

PCT Pub. Date: Apr. 24, 2003

(65) Prior Publication Data

US 2004/0253827 A1    Dec. 16, 2004

(30) Foreign Application Priority Data

Oct. 16, 2001    (EP) .................................. 01203942

(51) Int. Cl.
*H01L 21/8242* (2006.01)
(52) U.S. Cl. ...................... 438/251; 438/183; 438/195; 438/241; 438/243; 438/244; 438/245; 438/246; 438/247; 438/252; 438/253; 438/258; 438/622; 438/623; 438/773; 438/774; 257/E21.243; 257/E21.244; 257/E21.688; 257/E21.689

(58) Field of Classification Search ................ 438/183, 438/195, 241, 243–253, 258, 275, 259, 396–399, 438/622–624, 632, 926; 257/296, 306, 499, 257/649, 758, 773–775
See application file for complete search history.

(56) References Cited

U.S. PATENT DOCUMENTS

| 5,361,234 A | * | 11/1994 | Iwasa ......................... 365/210 |
| 5,441,915 A | * | 8/1995 | Lee ............................ 438/631 |
| 5,607,868 A | * | 3/1997 | Chida et al. ................. 438/258 |
| 6,030,876 A | * | 2/2000 | Koike ......................... 438/303 |
| 6,458,655 B1 | * | 10/2002 | Yuzuriha et al. ............. 438/257 |

* cited by examiner

OTHER PUBLICATIONS

Wolf et al. Silicon Processing for the VLSI Era, vol. 1—Process Technology, Second Edition, Lattice Press 2000, pp. 666-667.*

*Primary Examiner*—Michael Lebentritt
*Assistant Examiner*—Kyoung Lee
(74) *Attorney, Agent, or Firm*—Peter Zawilski

(57) ABSTRACT

Method of manufacturing a semiconductor device, including a first baseline technology electronic circuit (1) and a second option technology electronic circuit (2) as functional parts of a system-on-chip, by:
manufacturing the first electronic circuit (1) with a first conductive layer (6; 6) that is patterned by subjecting an exposed layer portion thereof to Reactive Ion Etching (RIE);
manufacturing the second electronic circuit (2) with a second conductive layer (6; 8) that is patterned by subjecting an exposed layer portion thereof to RIE;
providing a tile structure (25; 26);
providing the tile structure (25; 26) with at least one dummy conductive layer (6; 8) produced in the same processing step as the second conductive layer (6; 8); and
exposing the dummy conductive layer (6; 8), at least partially, to obtain an exposed dummy layer portion, and RIE-etching of that exposed portion too when the second (6; 8) conductive layer is subjected to RIE.

11 Claims, 10 Drawing Sheets

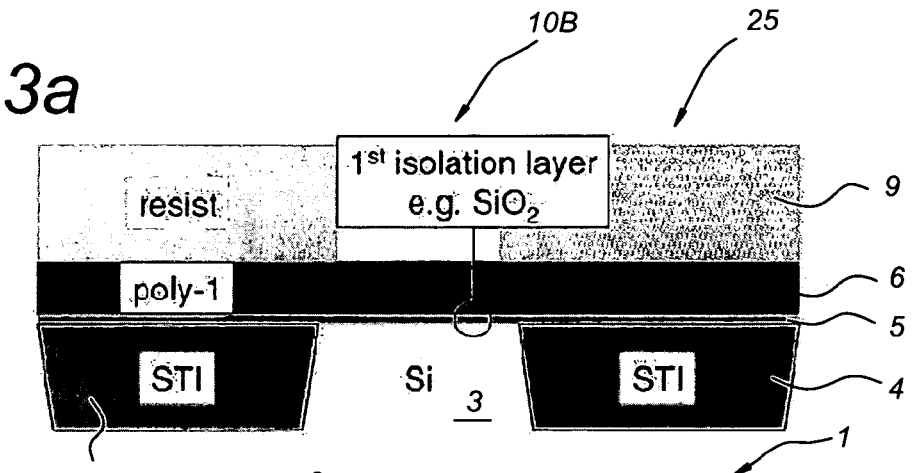
Fig 3a
Fig 3b
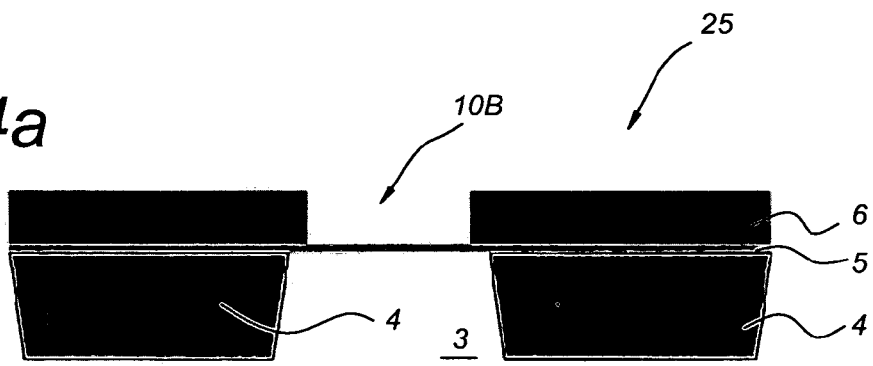
Fig 4a
Fig 4b

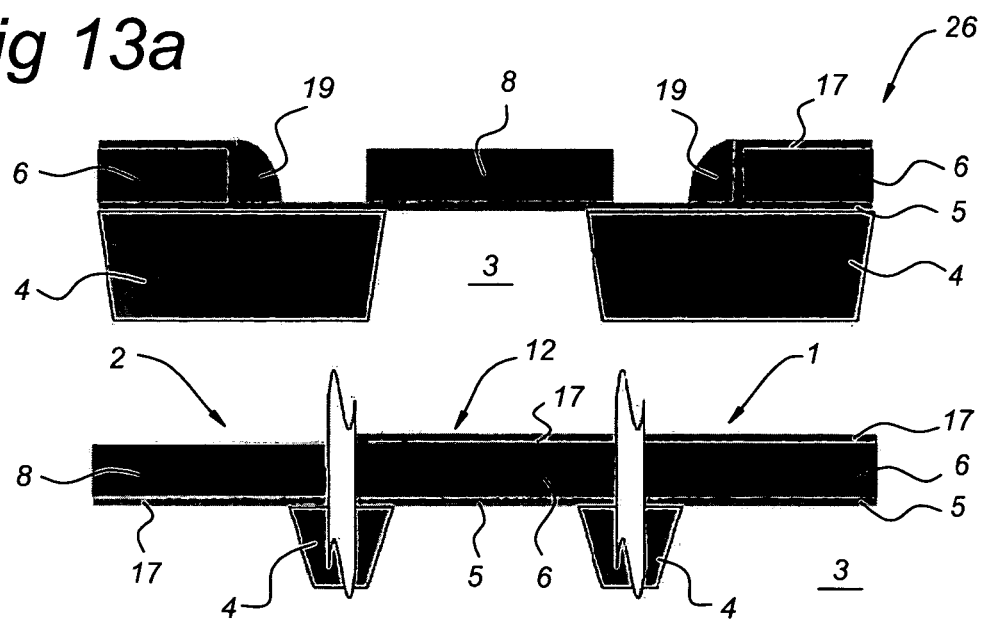
Fig 13a
Fig 13b
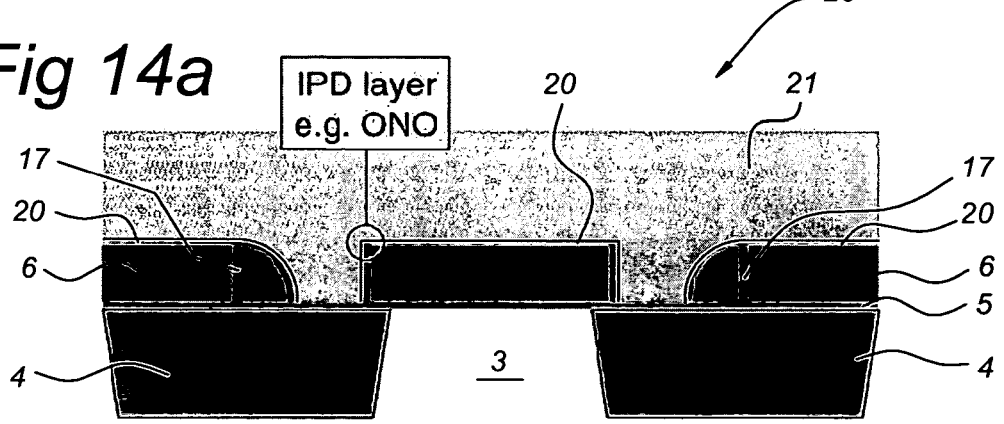
Fig 14a
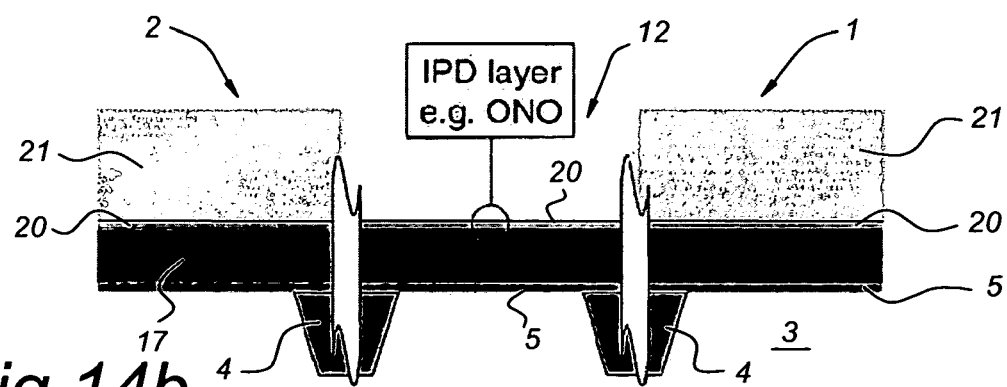
Fig 14b

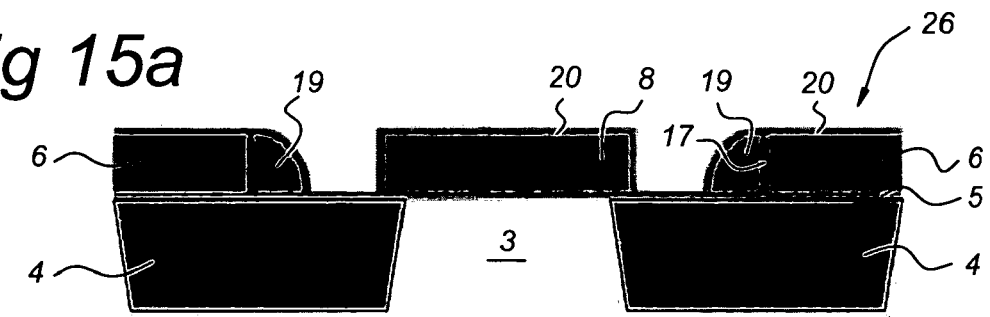
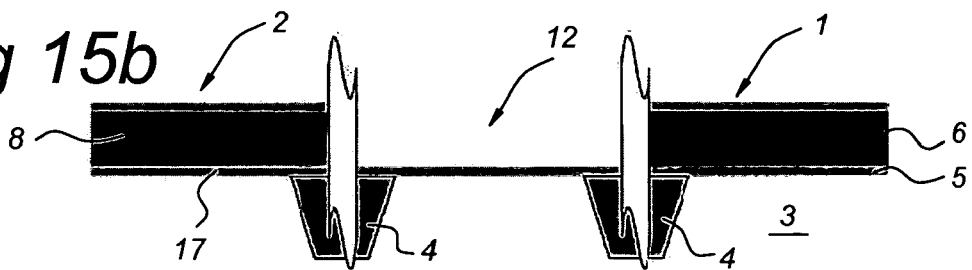
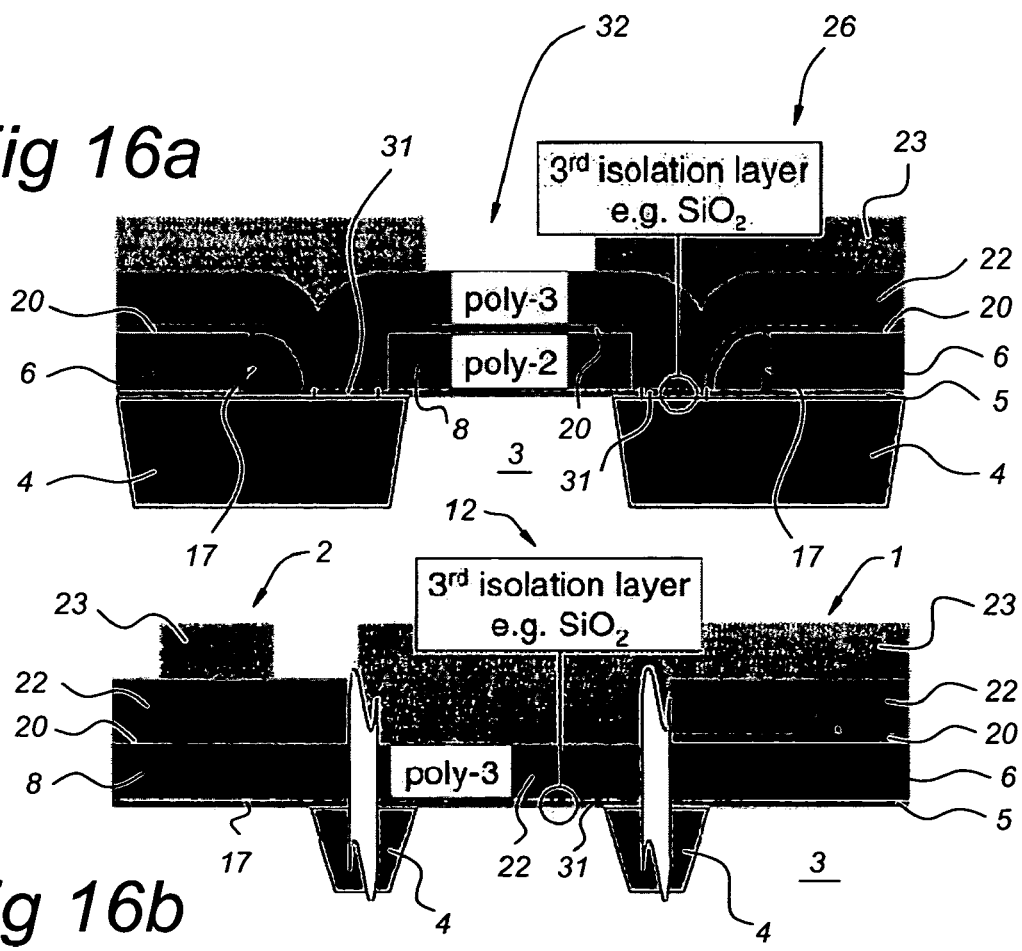

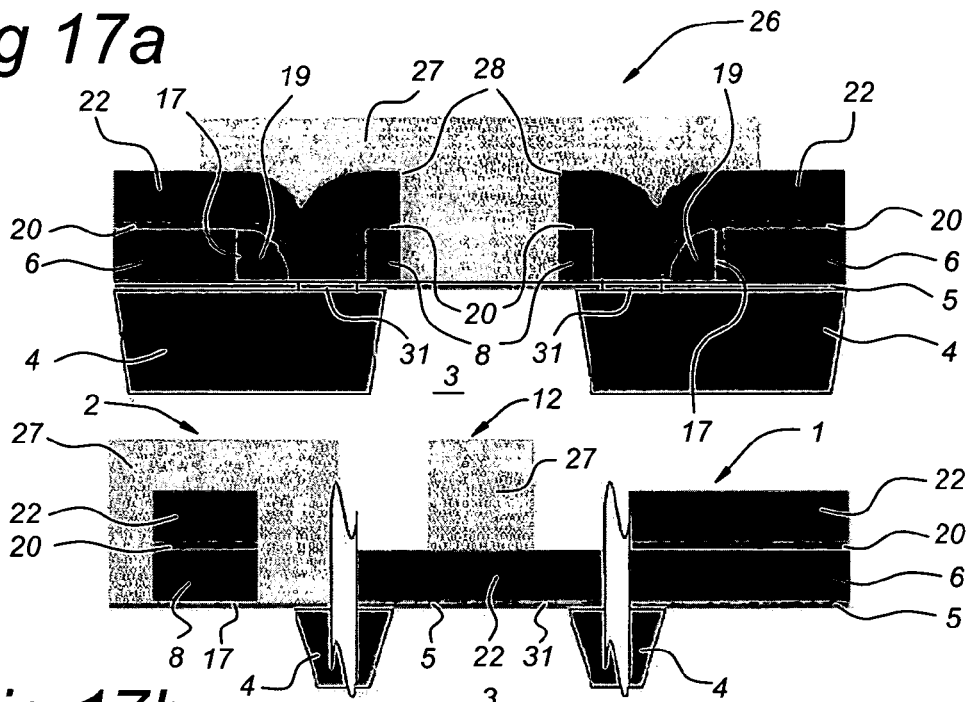
*Fig 17a*
*Fig 17b*
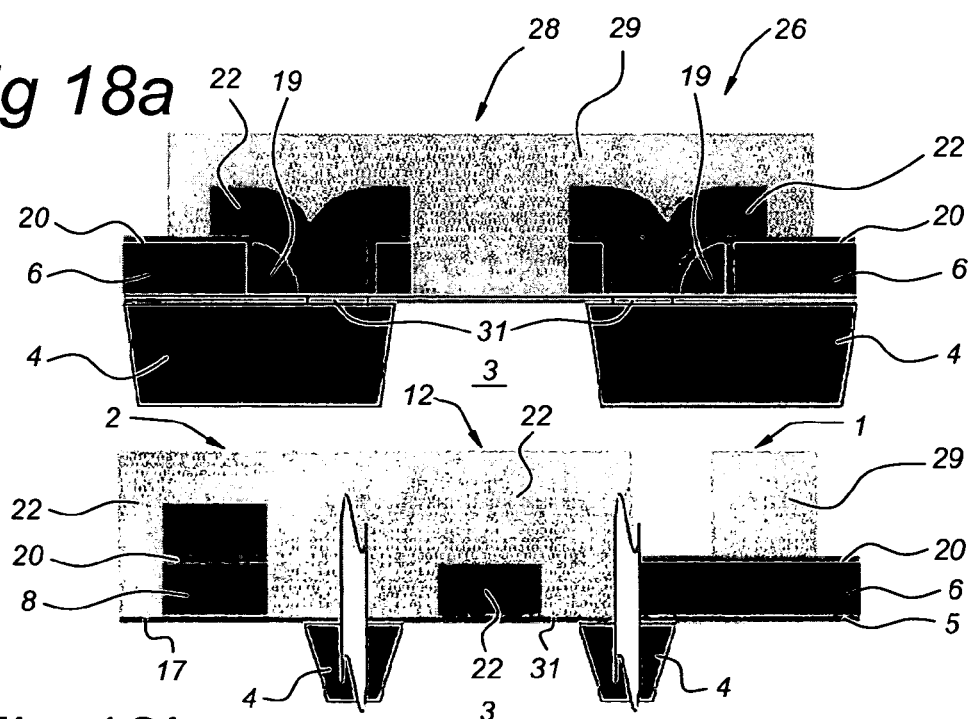
*Fig 18a*
*Fig 18b*

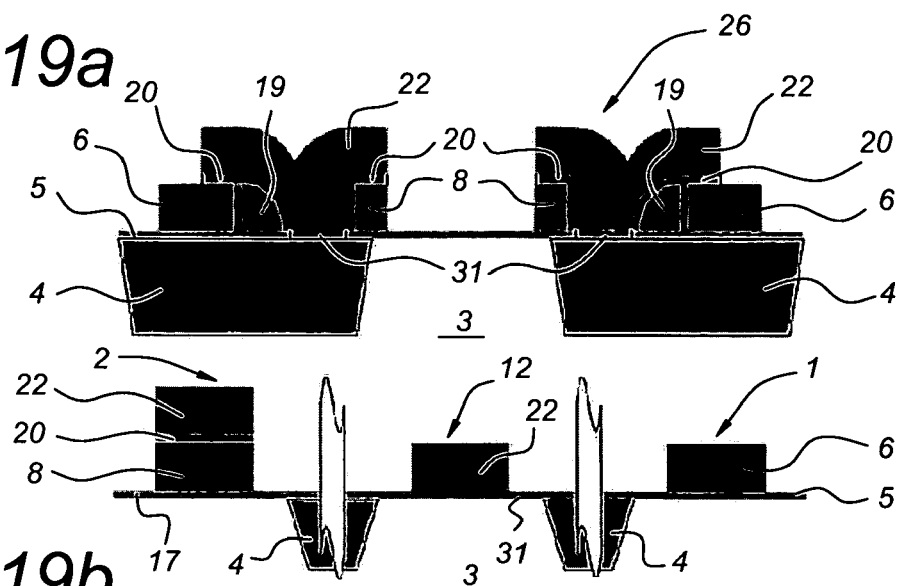
Fig 19a
Fig 19b
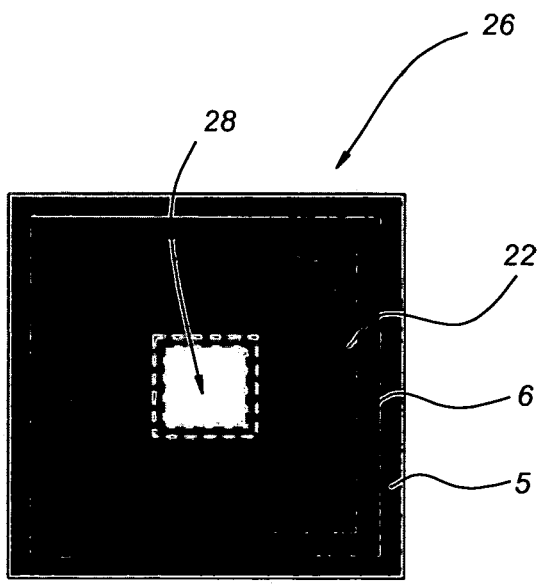
Fig 20a
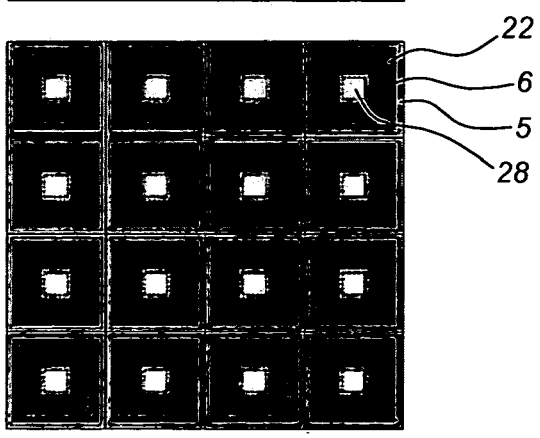
Fig 20b

MULTILEVEL POLY-SI TILING FOR SEMICONDUCTOR CIRCUIT MANUFACTURE

The present invention relates to a method of manufacturing a semiconductor device as defined in the preamble of claim 1.

The manufacture of "system-on-chip" (SOC) devices is a challenge to current ULSI technology. In such a system-on-chip, device structures which initially were fabricated separately are combined on a single chip. This allows for example analog, bipolar, (non-volatile) memory and logic CMOS technologies to be combined on a small semiconductor area. The joining of these technologies to manufacture a system-on-chip requires advanced processing technology. Usually, a mainstream process for a baseline technology is extended to embed one, or more, other technologies as an option. CMOS technology requires single level poly-Si manufacturing technology, but other technologies such as analog, bipolar and (non-volatile) memory require multilevel poly-Si manufacturing technology.

Embedding a multilevel poly-Si device structure (as option, e.g., bipolar) in a single level poly-Si device structure (as baseline, e.g., CMOS) causes several manufacturing technology-related problems.

A main problem is related to non-planarity in the interlevel dielectric areas between multilevel poly-Si and single level poly-Si areas of a system-on-chip.

Non-planarity may cause problems relating to the small depth of focus in photolithographic steps. For example, resist non-uniformity may lead to a variation of critical dimensions due to the small depth of focus in a photolithographic step.

Also, in reactive ion etching (RIE) processes, non-planarity may cause contact openings in thinner dielectric areas to be overetched in comparison to contact openings in thicker dielectric areas.

From U.S. Pat. No. 5,281,555 a method is known to reduce the step difference in interlevel dielectric areas by introducing dummy poly-Si objects in the interlevel dielectric areas. By fabricating these dummy poly-Si objects in the interlevel dielectric, the step difference between multilevel poly-Si and single level poly-Si becomes less steep. The reduced steepness ensures that the undesirable formation of stringers on the interlevel dielectric area during processing is prevented. The method disclosed in U.S. Pat. No. 5,281,555 is used only for local reduction of step differences, not for planarisation of the entire chip area.

In DE 197 57 417 a method is disclosed for improving planarisation by introducing dummy objects in peripheral areas near a central area which contains e.g. a CMOS structure. Here the dummy objects (layers) are used to prevent overetching of a contact opening in e.g. a gate located below the contact. Similar to U.S. Pat. No. 5,281,555, the method of DE 197 57 417 is used only for a local reduction of step differences.

In both U.S. Pat. No. 5,281,555 and DE 197 57 417 the dummy objects must be located at specific positions to locally solve technology-related problems such as described above. This requires specific attention during the design phase. Also, the formation at specifically defined locations may require additional steps during the manufacturing process.

Furthermore, the combination of multilevel poly-Si and single level poly-Si technologies in a single system-on-chip may cause additional problems when the option technology is used for only a small area of the system-on-chip. The processing steps involving the option technology must be carefully optimized to avoid e.g., resist non-uniformity, decrease of (etch) selectivity, and problems relating to end point detection during poly-Si RIE processing.

It is an object of the present invention to reduce the occurrence of problems relating to non-planarity in combined poly-Si technologies (possibly having different numbers of levels). Also, it is an object of the present invention to reduce the occurrence of problems relating to reactive ion etching during the manufacture of devices using such combined poly-Si technologies and to overcome the strong variation of processing parameters in relation to the area to be formed by the option technology.

In a first preferred embodiment, the present invention relates to a method of manufacturing a semiconductor device on a semiconductor substrate, comprising a first electronic circuit in a baseline technology and at least a second electronic circuit in a first option technology, the first and second electronic circuits being functional parts of a system-on-chip, the method comprising the following steps:

manufacturing the first electronic circuit with at least a first conductive layer that is patterned by subjecting an exposed portion of the first conductive layer to Reactive Ion Etching;

manufacturing the second electronic circuit with at least a second conductive layer that is patterned by subjecting an exposed portion of the at least second conductive layer to Reactive Ion Etching;

providing at least one dummy structure;

wherein the method comprises the following steps:

providing the at least one dummy structure with at least one dummy conductive layer produced in the same processing step as one of the at least second conductive layers;

exposing at least a portion of the at least one dummy conductive layer to obtain an exposed portion of the at least one dummy conductive layer, and Reactive Ion Etching of the exposed portion of the at least one dummy conductive layer too when one of the at least second conductive layers is subjected to Reactive Ion Etching.

Moreover, the present invention relates to a method of manufacturing a semiconductor device on a semiconductor substrate, as described above, the method further comprising the following step:

manufacturing the second electronic circuit with at least a third conductive layer that is separated from the at least second conductive layer by a dielectric layer and that is patterned by subjecting an exposed portion of the at least third conductive layer to Reactive Ion Etching;

wherein the method comprises the following steps:

providing the at least one dummy structure with at least one dummy conductive layer produced in the same processing step as one of the at least second and at least third conductive layers;

exposing at least a portion of the at least one dummy conductive layer to obtain an exposed portion of the at least one dummy conductive layer, and Reactive Ion Etching of the exposed portion of the at least one dummy conductive layer too when one of the at least second and third conductive layers is subjected to Reactive Ion Etching.

By providing the dummy structures consisting of multilevel poly-Si, it is possible to change the overall ratio between the respective areas of the combined poly-Si technologies including different numbers of levels in the actual system-on-chip in such a way that the amount of area to be processed by the option technology can be changed to be within the limits of RIE processing with constant etch rates and selectivity, and accurate and reliable end-point detection.

Also, due to the improvement of the RIE processing by constant etch rates and selectivity, the method of manufacturing a semiconductor device in accordance with the present invention advantageously reduces the overall non-planarity of the interlevel dielectric areas between areas with different poly-Si levels. The method of the present invention enables the method of the prior art comprising the introduction of dummy poly-Si objects in these interlevel dielectric areas between areas with different poly-Si levels to be omitted.

Furthermore, in the method of manufacturing a semiconductor device in accordance with the present invention, the requirements imposed on the design phase are relaxed as compared to the prior art requirements, since the dummy structures can be placed at any location on the semiconductor substrate, which originally is not occupied by the system-on-chip.

In a second preferred embodiment, the present invention relates to a method as described above, wherein the semiconductor substrate also comprises at least a third electronic circuit in a second option technology, the at least third electronic circuit having at least a fourth conductive layer produced in the same processing step as the at least one dummy conductive layer, the at least third electronic circuit being a further functional part of the system-on-chip, the method comprising the step of Reactive Ion Etching of at least part of the fourth conductive layer when the at least one dummy conductive layer is subjected to Reactive Ion Etching.

Moreover, the present invention relates to a semiconductor device manufactured as described above, wherein the dummy structure is placed at a location on the semiconductor substrate, which is left unoccupied by the system-on-chip.

Below, the invention will be explained with reference to some drawings, which are intended for illustration purposes only and not to limit the scope of protection as defined in the accompanying claims.

FIGS. 3a and 3b show schematically, according to a first preferred embodiment of the present invention, a dummy structure and a cross-section of the two types of devices/technologies, respectively, after a first gate oxidation and a first poly-Si deposition and definition of a resist pattern;

FIGS. 4a and 4b show the dummy structure and, schematically, a cross-section of the two types of technologies, respectively, after patterning of the first poly-Si layer;

FIGS. 13a and 13b show schematically the dummy structure and a cross-section of the three types of devices/technologies, respectively, after patterning of the second poly-Si layer by a RIE process.

FIGS. 14a and 14b show schematically the dummy structure and a cross-section of the three types of devices/technologies, respectively, after the deposition of a second inter-poly dielectric layer and the formation of a resist pattern;

FIGS. 15a and 15b show schematically the dummy structure and a cross-section of the three types of devices/technologies, respectively, after reactive ion etching of the inter-poly dielectric layer and poly-Si layer;

FIGS. 16a and 16b show schematically the dummy structure and a cross-section of the three types of devices/technologies, respectively, after the deposition of a third poly-Si layer and the formation of a resist pattern;

FIGS. 17a and 17b show schematically the dummy structure and a cross-section of the three types of devices/technologies, respectively, after the patterning of a double poly-Si structure in a first option technology and the formation of a resist pattern;

FIG. 18a and FIG. 18b show schematically the dummy structure and a cross-section of the three types of devices/technologies, respectively, after the patterning of a single poly-Si structure in a second option technology and the definition of a resist pattern;

FIGS. 19a and 19b show schematically the dummy structure and the final cross-section of the three types of devices/technologies, respectively, after patterning a baseline structure;

FIGS. 20a and 20b show schematically a top view of a single dummy structure and multiple dummy structures, respectively.

As described above in relation to the prior art, processing steps for semiconductor devices involving one or more option technologies in combination with a baseline technology must be carefully optimized to avoid e.g., loss of planarity, decrease of (etch) selectivity, and problems relating to end-point detection during poly-Si RIE processing. Reactive ion etching (RIE) of planar structures in a relatively small area, is explained with reference to FIG. 1. It should be noted that dimensions of the structures shown in the following FIGS. 1–20 are not drawn to the same scale.

Figure 1:
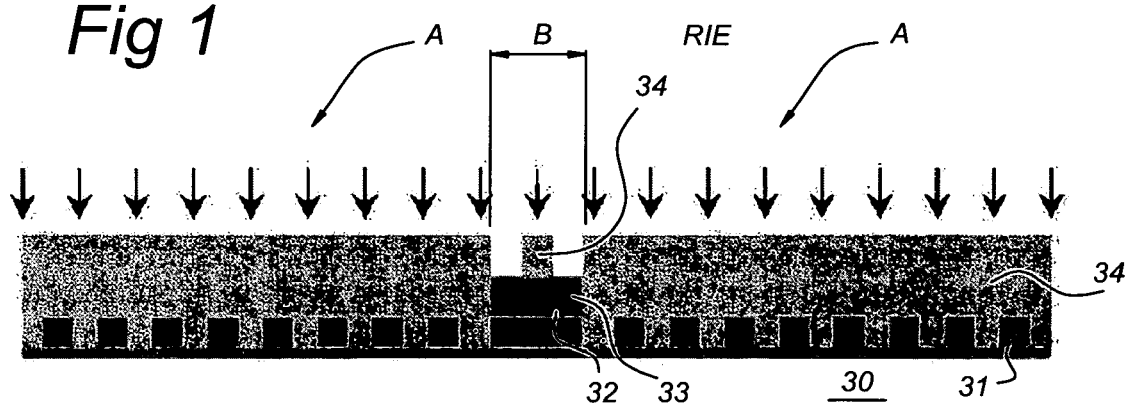
FIG. 1 shows a cross-section of a combination of baseline and option technologies, during reactive ion etching (RIE) of a small open area over the option technology.

FIG. 1 shows a cross-section of a combination of baseline and option technologies, during reactive ion etching (RIE) of a small open area over the option technology.

On a substrate 30 an area A comprising a baseline technology, and an area B comprising an option technology are formed. Area A comprises a first patterned poly-Si layer 31. Area B also comprises the first poly-Si layer 31 as well as an inter-poly dielectric layer 32 and a second poly-Si layer 33. On top of area A and area B a resist layer 34 is deposited. Resist layer 34 is patterned in area B for etching the option technology structure.

Since the open area of the option technology is relatively small (in this case e.g., about 10% of the entire chip area), the amount of by-product(s) caused by etching will be relatively small and, accordingly, an end-point detection signal, related to a measured amount of by-product(s), will be relatively weak. End-point detection in the RIE process may thus become inaccurate and unreliable, due to the proportionality of the end-point signal and the processed area. Inaccurate and unreliable end-point detection may lead to over-etching (or incomplete etching) of device features, as is known to persons skilled in the art.

Moreover, with an area coverage of less than about 10% for the option technology part of the system-on-chip, or more than about 90% for the baseline technology part, etch rates and selectivity may change strongly with the actually processed area (due to the 'loading effect', as known by persons skilled in the art). With an area coverage of the option technology between about 10% and 90%, etch rates and selectivity are substantially constant. Also, end-point detection will be accurate and reliable in that range.

As will be explained below, the present invention simplifies processing of a combination of an option technology and a baseline technology in a single manufacturing process by providing a dummy structure the purpose of which is to provide the relatively small area B with an additional area consisting of option technology. Thus, relative to the baseline area A, an enlarged option technology area is created which is exposed to the reactive ion etch process. Actually, in a manufacturing process comprising various RIE steps, the dummy structure may add the necessary additional poly-Si area to any small poly-Si area exposed in each RIE processing step. If required, the dummy structure may also add an additional area to a small exposed area in the baseline technology.

The dummy structure encompasses an additional area of such a size that the area of the dummy structure to be etched and the original area to be etched is within the range of about 10–90% of the total area.

The needed additional area on the dummy structure can be derived from the transmittance of a mask used in the definition of a resist pattern to be etched in the actual area of the option technology of the system-on-chip. Transmittance may be defined here as the percentage of open area of the system-on-chip that is not covered by the resist pattern relative to the total system-on-chip area.

From the transmittance of the mask for the option technology, a compensating area on the dummy structure can be calculated. In the dummy structure, a layer structure similar to the option technology layer structure is created which will be RIE-processed at the same time as the actual option technology. The open area in the dummy structure is such that the total area of exposed material during RIE-processing is within the limits for an accurate and reliable end-point detection of that process. By means of the dummy structure according to the present invention, it is feasible to mix baseline technology and option technology in a single process without the drawbacks mentioned above.

Moreover, the dummy structure is also useful for deposition processes to form e.g. interlevel dielectric layers. Exposure of the dummy structure in such a deposition process allows the formation of planar interlevel dielectric layers of uniform thickness. As is known to persons skilled in the art, in some technologies (e.g. bipolar) such interlevel dielectric layers may be unnecessary between poly-Si layers.

Figure 2A:
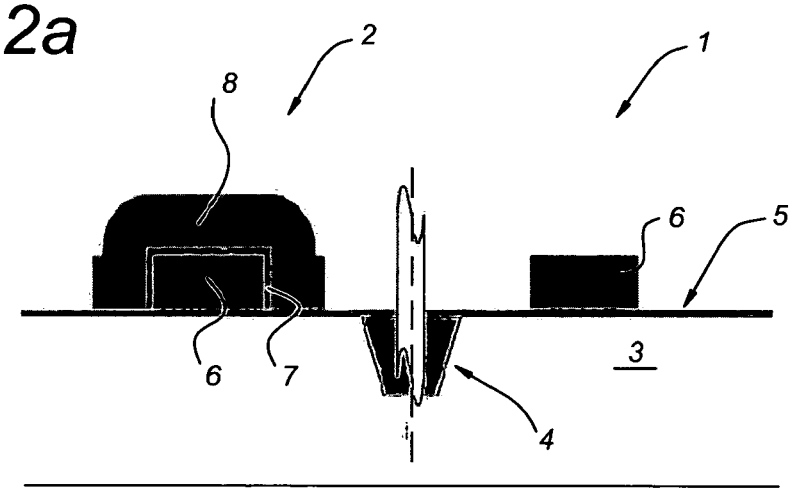
FIGS. 2a and 2b show schematically a cross-section and a chip layout of an exemplary structure of two types of devices/technologies made within a single process using two poly-Si layers in accordance with the present invention.
Figure 2B:
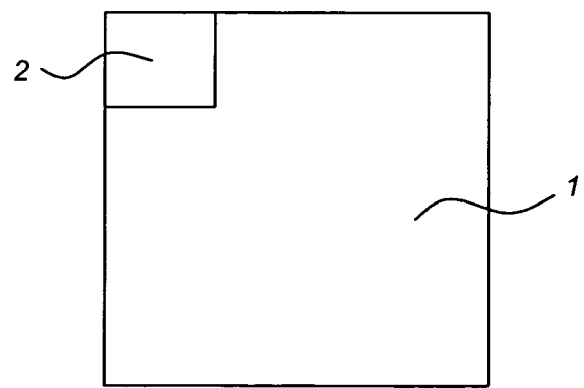

FIGS. 2a and 2b show schematically a cross-section and a chip layout, respectively, of an exemplary structure of two types of devices/technologies made within one process using two poly-Si layers, in accordance with the present invention.

The exemplary structure comprises two types of devices/technologies which are schematically separated into two blocks 1, 2, with a typical ratio between the areas occupied by the two technologies.

Block 1 represents the baseline technology and occupies the main part of the area of the system-on-chip. Block 2 represents the option technology and occupies a small area of the system-on-chip.

Block 1 comprises a baseline single poly-Si technology, block 2 comprises a double poly-Si structure as option technology. In FIG. 2a a cross-section of the exemplary structure is shown. On a substrate 3, a shallow trench isolation (STI) 4 is formed. In block 1 a single poly-Si structure comprising a first gate isolation 5 and a first poly-Si layer 6 are located. In block 2, on the surface, a double poly-Si structure comprising the first poly-Si layer 6, an interlevel dielectric layer 7 and a second poly-Si layer 8 are located.

In the schematic chip layout of FIG. 2b, the relative areas of the two types of technologies are depicted. Block 1 represents the baseline technology. Block 2 represents the option technology which occupies a relatively small area of less than, e.g., 10%.

It should be noted that although only the use of polysilicon layers is mentioned in this description, amorphous silicon may alternatively be used.

Moreover, the thickness of the second poly-Si layer 8 may be different from the thickness of the first poly-Si layer 6, as will be explained below.

In the following FIGS. 3–8, the formation of the structures as shown in FIGS. 2a and 2b is illustrated with reference to the successive processing steps.

In the FIGS. 3–8, entities bearing the same reference numberals refer to the same entities as in FIGS. 2a and 2b.

FIGS. 3a and 3b show schematically according to a first preferred embodiment of the present invention a dummy structure and a cross-section of the two types of devices/technologies, respectively, after a first gate oxidation 5 and a first poly-Si deposition 6 and definition of a resist pattern.

In the exemplary structure of FIGS. 2a and 2b, the RIE processing of the option technology in a single manufacturing process for block 1 and block 2, may be complicated due to a small area size of the option block 2. Therefore, according to the present invention, a dummy structure 25 is formed which adds an additional open area to the small area size of block 2 to improve the characteristics of etching of that small area of block 2 when it is exposed in a RIE process. On the semiconductor wafer, in addition to the baseline technology (block 1) and the option technology (block 2), a dummy area (block 25) is formed on substrate 3.

Thus, the exposed area during the reactive ion etching of the option technology area (block 2) can be made sufficiently large to provide an end-point detection signal having sufficient intensity to be accurate and reliable (in a single process for simultaneous RIE-etching of block 2 and part of the dummy structure 25).

On substrate 3, on both block 1, block 2 and block 25 isolations STI 4 are formed and required wells are implanted. Furthermore, a first gate oxidation layer 5 is formed. On top of gate oxidation layer 5, a first poly-Si layer 6 is deposited by a deposition process of the kind known in the art. After deposition of the first poly-Si layer 6, a resist layer 9 is applied. The resist layer 9 is patterned in the area of block 1 and the area of block 2 as a first step to form the structure as shown in FIGS. 2a and 2b.

In the resist pattern on block 2, an open area 10A is defined. In block 25, an open area 10B is patterned in the resist layer 9 to provide an additional poly-Si area which will also be exposed to the reactive ion etch process simultaneously with the open area 10A in block 2. Area 10B in dummy block 25 adds to the area of block 2 (the option technology) in such a way that the end-point detection of the RIE process becomes accurate and reliable. The size of area 10B, which is necessary as an additional area, can be derived (indirectly) from the transmittance of the mask used to define the resist pattern on block 1 and block 2. The transmittance can be defined as the percentage of open area 10A over the total area of (the mask projected on) the semiconductor wafer. Open area 10B is added to open area 10A to increase the transmittance to be substantially within the range of 10%–90%.

FIGS. 4a and 4b show the dummy structure 25 and a schematic cross-section of the two types of technologies, respectively, after patterning of the first poly-Si layer.

After the reactive ion etch process and the removal of the resist layer 9, the first poly-Si layer 6 in block 1 has been patterned, and simultaneously, the area 10B in block 25 is open. Due to the enhancement of the end-point detection of the RIE process, both in block 2 and in dummy block 25 the etch process has stopped at the first gate oxidation layer 5, acting as an etch-stop.

Figure 5A:
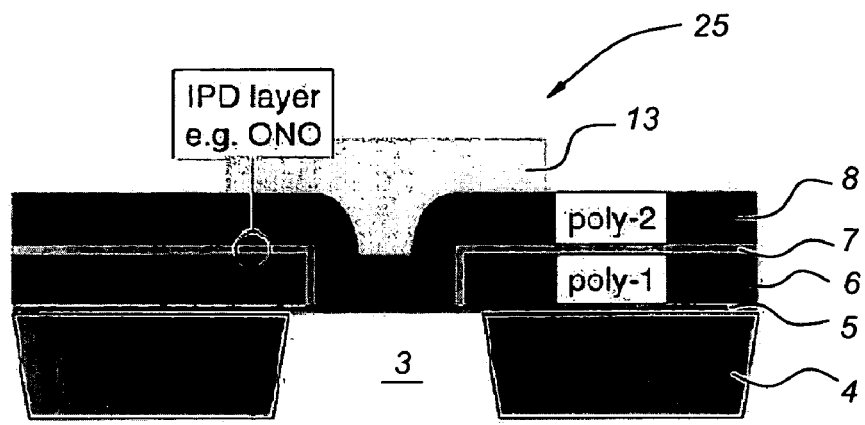
FIGS. 5a and 5b show schematically the dummy structure and a cross-section of the two types of technologies, respectively, after deposition of an inter-poly dielectric layer and a second poly-Si layer, and subsequent patterning of a resist layer.
Figure 5B:
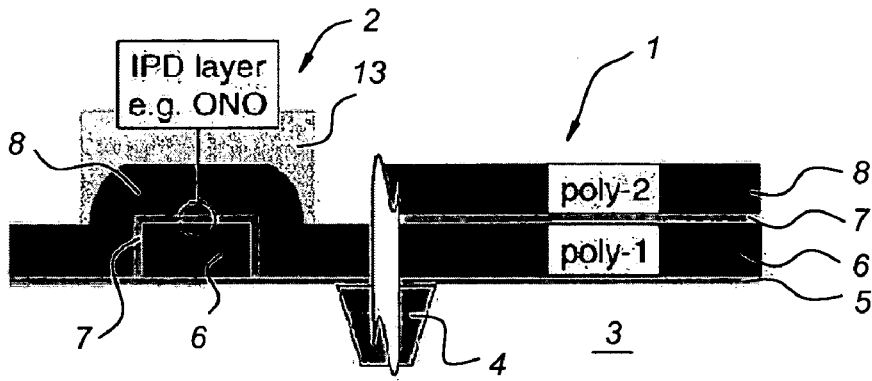

FIGS. 5a and 5b show schematically the dummy structure 25 and a cross-section of the two types of technologies, respectively, after deposition of an inter-poly dielectric layer 7 and a second poly-Si layer 8, and subsequent patterning of a resist layer.

On top of the structures shown in FIGS. 4a and 4b, an inter-poly dielectric isolation layer 7, consisting of e.g., a silicon-dioxide layer (oxide, $SiO_2$), an oxide-nitride bi-layer (ON) or an oxide-nitride-oxide multilayer (ONO), is deposited to form an isolation over the underlying structure. The inter-poly dielectric layer 7 covers the surface and the side walls of the first poly-Si layer 6. Next, a second poly-Si layer 8 is deposited on top of the inter-poly dielectric layer 7.

Subsequently, a resist layer 13 is applied on top of the second poly-Si layer 8. The resist layer 13 is patterned in order to form the desired structure in block 1 (FIGS. 2a and 2b). On the dummy structure 25, the resist layer 13 is patterned in such a way that the resist-covered area of the second poly-Si layer 8 enlarges the resist-covered area of the second poly-Si layer 8 in block 1 and block 2 to provide an accurate and reliable end-point detection during a subsequent RIE process. The open area of the resist layer 13 exposing underlying material is again related to the open area of the resist pattern 13 on block 2 (as defined by the mask) in order to have an exposed area during RIE-processing well within the range of ~10–~90% of the wafer area. After the RIE process the structure of block 2 has been completed.

The thickness of poly-Si layer 8 may differ from the thickness of first poly-Si layer 6. Since the RIE process only acts on poly-Si layer 8 and stops on inter-poly dielectric layer 7 or first gate isolation layer 5, overetching (or incomplete etching) of the combined baseline and option technology blocks, as occurred in the prior art, will not take place.

Figure 6A:
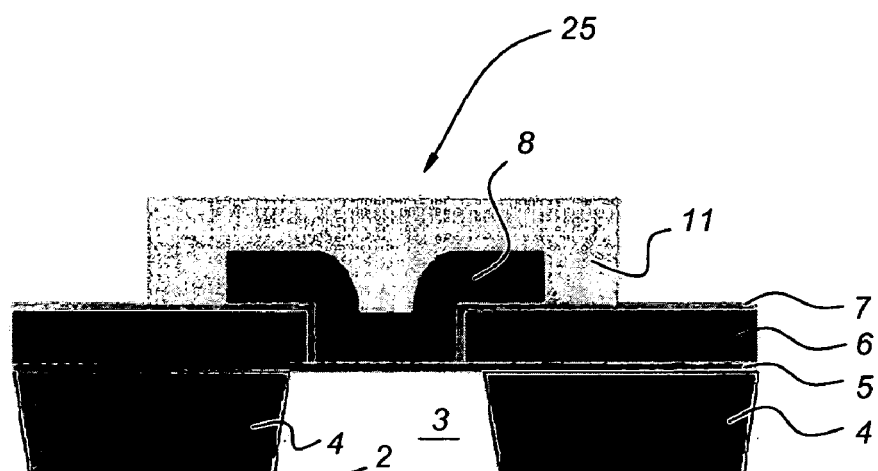
FIGS. 6a and 6b show schematically the dummy structure and a cross-section of the two types of technologies respectively, after patterning of the second poly-Si layer by RIE, and a subsequent resist patterning step.
Figure 6B:
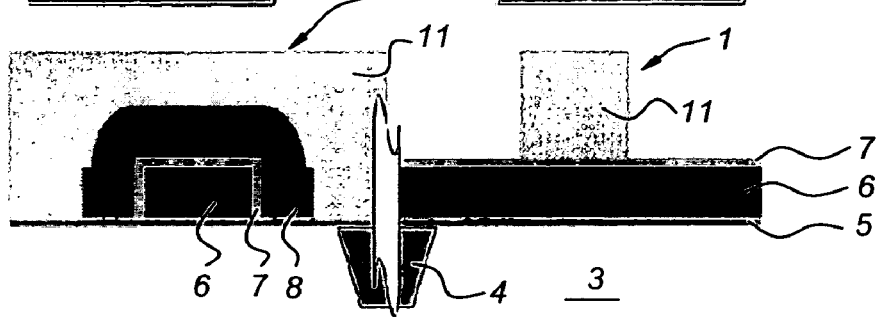

FIGS. 6a and 6b show schematically the dummy structure 25 and a cross-section of the two types of technologies, respectively, after patterning of the second poly-Si layer 8 by RIE, and a subsequent resist patterning step.

After the RIE-process shown in FIGS. 5a and 5b the structure of block 2 has been completed. In the dummy structure 25, the second poly-Si layer 8 has taken the form shown. On top of the structures in block 1, block 2 and block 25, as formed by the RIE process, a resist layer 11 is applied. The resist layer 11 is then patterned in such a way that the open area exposing layer 7 in block 25 enlarges the open area in block 1 to such an extent that reliable end-point detection during a subsequent RIE process is feasible. Since block 1 represents the baseline technology (being the main area of the system-on-chip), the open area in block 1 may be large enough not to require additional area on the dummy structure 25 to be exposed in the RIE process. The need to define an area on the dummy structure 25 for exposure to the RIE process depends on the actual area of block 1 that will be exposed.

Figure 7A:
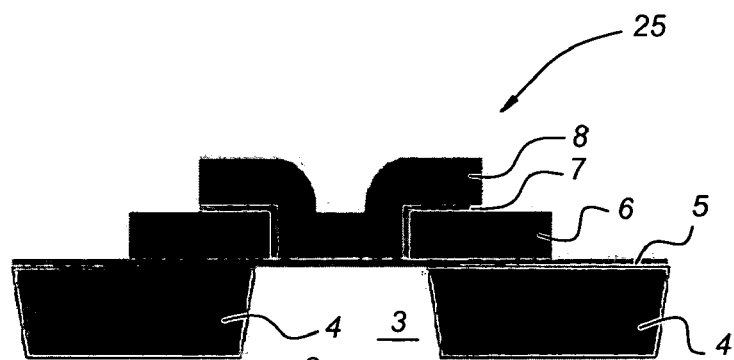
FIGS. 7a and 7b show schematically the dummy structure and a cross-section of the two types of technologies, respectively, after patterning the baseline technology.
Figure 7B:
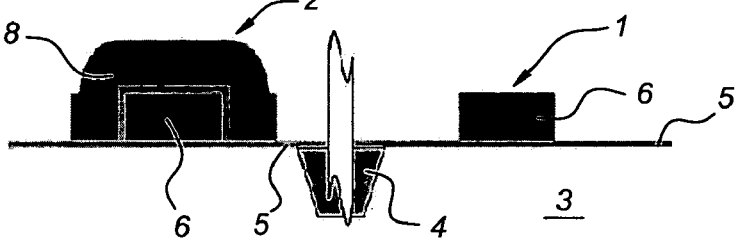

Finally, FIGS. 7a and 7b show schematically the dummy structure 25 and a cross-section of the two types of technologies, respectively, after patterning the baseline technology in block 1.

Due to the presence of the dummy structure 25 during the RIE process, the end-point detection can be done in a reliable manner, and the RIE process can be stopped at the first gate oxidation layer 5. Thus, by providing a dummy structure 25, it is feasible to manufacture a combined baseline technology/option technology structure in a single manufacturing process.

Figure 8A:
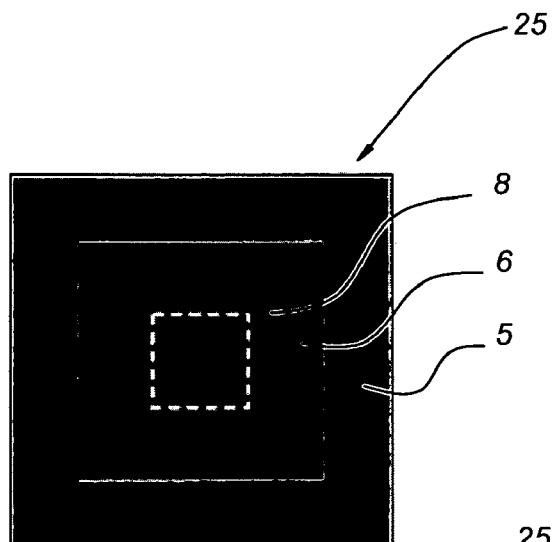
FIGS. 8a and 8b show schematically a top view of a single dummy structure and of a plurality of dummy structures, respectively.
Figure 8B:
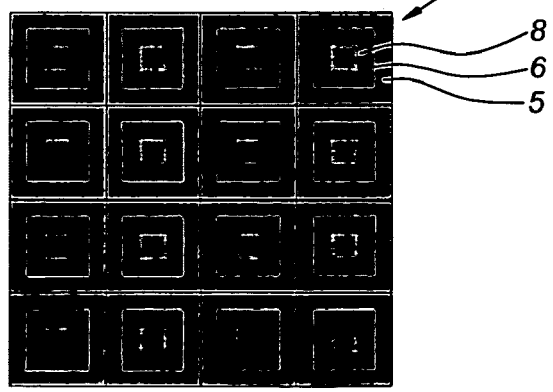

FIGS. 8a and 8b show schematically a top view of a single dummy structure 25 and of a plurality of dummy structures 25, respectively.

The single dummy structure 25 and the plurality of dummy structures 25, as shown in FIGS. 8a and 8b, respectively, are tile-shaped, preferably rectangular or square, although other shapes are possible. The final dimensions of the different layers (the first gate oxidation layer 5, the first poly-Si layer 6 and the second poly-Si layer 8) of the dummy structure 25 result from the necessity of adding additional area to the respective layers during the processing of the original structures in block 1 and block 2. The actual ratio between the surface areas of the respective layers 6 and 8 in the dummy structure 25 is a function of the surface areas of the layers 6 and 8 as present in the structures of block 1 and block 2. It will be appreciated that the actual form of the dummy structure 25 will thus depend on the device structures in block 1 and block 2, and the ratio of the actual area occupied by these device structures in these blocks over the total area of the substrate 3.

It is to be noted that instead of the single dummy structure 25 as shown in FIG. 8a, a plurality of dummy structures 25 may be used as shown in FIG. 8b. Just as for a single dummy structure 25, the total area of the dummy structures 25 in FIG. 8b relates to the need for additional area of the respective layers during the processing of the original structures in block 1 and block 2.

Moreover, the dummy structure tiles 25 may be located in any location available on the semiconductor wafer. The tiles may be located close to a single system-on-chip, or they may be merged into the chip area. Also, they may be located in specifically designated areas of the semiconductor wafer, spaced apart from the actual dies comprising the system-on-chip. The dummy structure tiles 25 may also be positioned on scribelines, or under a bond pad or contact pad area, if necessary. (Later, the contact pad area may be formed on top of the dummy structure tile.)

It is also noted that the dummy structure tiles 25 may have various sizes, which permits each dummy tile 25 to be fitted into any available location of suitable dimensions.

Figure 9A:
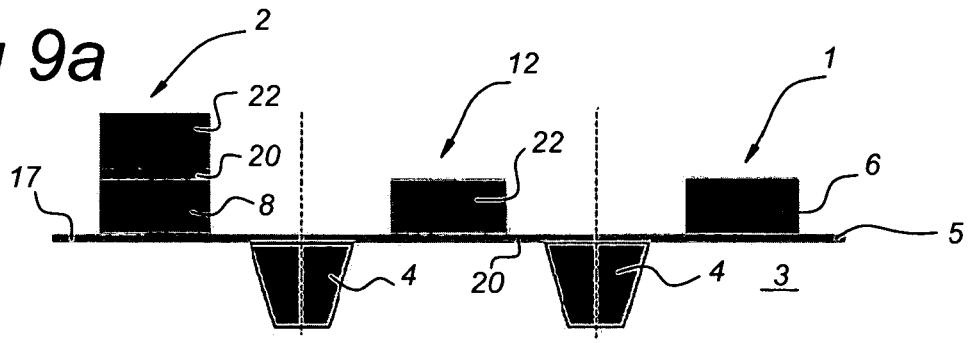
FIGS. 9a and 9b show schematically a cross-section and a chip layout, respectively, of an exemplary structure of three types of devices/technologies made within one process using three poly-Si layers.
Figure 9B:
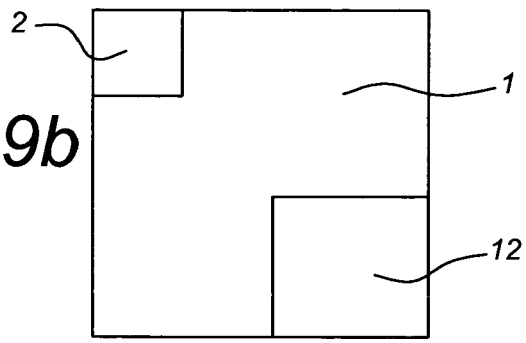

FIGS. 9a and 9b show schematically a cross-section of an exemplary structure of three types of devices/technologies made within one process using three poly-Si layers, and a chip layout of the exemplary structure, respectively.

The exemplary structure of FIGS. 9a and 9b consists of a baseline technology 1 and two option technologies 2, 12. The baseline technology, i.e. a single poly-Si technology, is represented in block 1. A first option technology is shown in block 2: this option technology schematically represents a double poly-Si technology device. A second option technology is represented by block 12.

Block 1 comprises a first gate oxidation layer 5, and a first poly-Si layer 6.

Block 2 comprises a second gate oxidation layer 17, a second poly-Si layer 8, an inter-poly dielectric 7, and a third poly-Si layer 16.

Block 12 comprises a third gate oxidation layer 20, and a second poly-Si layer 8.

The blocks 1, 2, and 12 are formed on a semiconductor substrate 3, and are separated by isolations STI 4.

Again, the baseline technology 1 encompasses the largest area of the system-on-chip. The blocks 2, and 12 occupy only minor parts of the area of the system-on-chip.

Figure 10A:
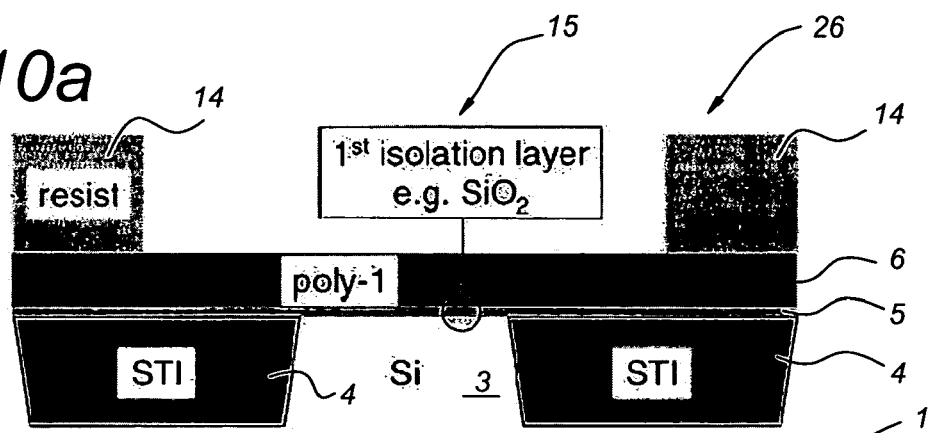
FIGS. 10a and 10b show schematically a dummy structure and, according to a second preferred embodiment of the present invention, a cross-section of the three types of devices/technologies, respectively after a first gate oxidation and a first poly-Si deposition.
Figure 10B:
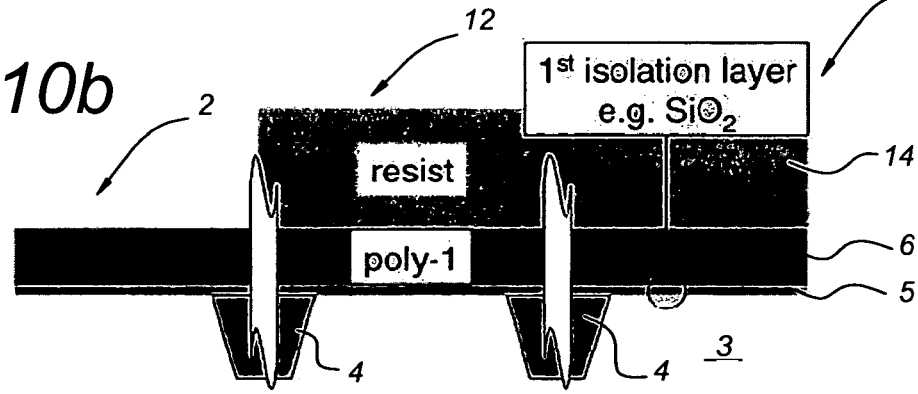

FIGS. 10a and 10b show schematically a dummy structure 26 and, according to a second preferred embodiment of the present invention, a cross-section of the three types of devices/technologies, respectively, after a first gate oxidation and a first poly-Si deposition.

The dummy structure 26 is provided to add, where needed, an additional area to the area to be etched by a reactive ion etching process.

On the surface of substrate 3, a first gate oxidation layer 5 is formed (by any oxidation or deposition process known in the art). On top of the first gate oxidation layer 5 a first poly-Si layer 6 is formed.

On top of the first poly-Si layer 6 a resist layer 14 is applied. Resist layer 14 is patterned in such a way that the area of block 2 is open. Accordingly, on the dummy structure 26 an area 15 within resist layer 14 is opened to add to the area of the first poly-Si layer 6. The size of area 15 is chosen to be such that the total area of block 2 and area 15, where first poly-Si layer 6 is exposed to a RIE process, enables the RIE process with an accurate and reliable end-point detection.

Figure 11A:
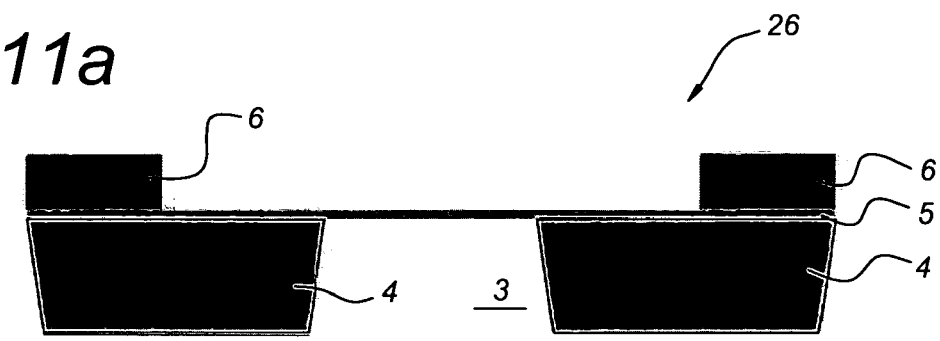
FIGS. 11a and 11b show schematically the dummy structure and a cross-section of the three types of devices/technologies, respectively, after patterning of the first poly-Si layer.
Figure 11B:
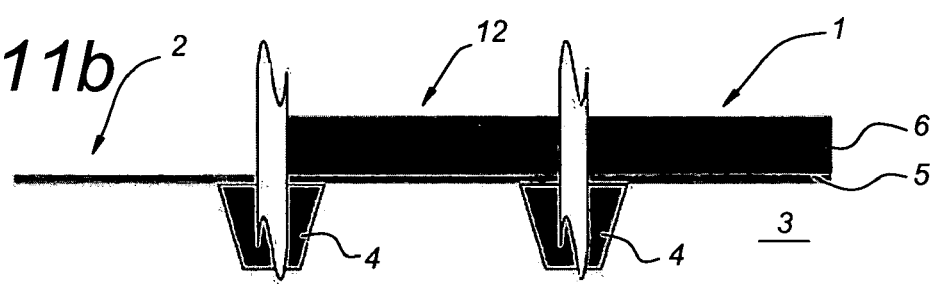

FIGS. 11a and 11b show schematically the dummy structure 26 and a cross-section of the three types of devices/technologies, respectively, after patterning of the first poly-Si layer 6.

Figure 12A:
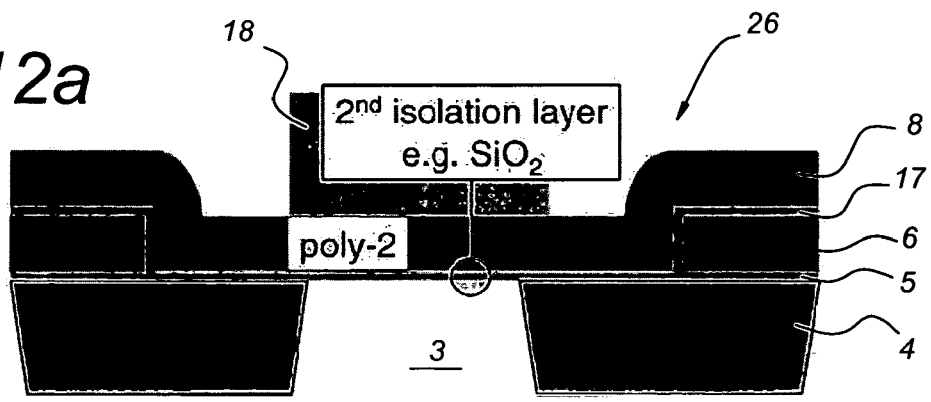
FIGS. 12a and 12b show schematically the dummy structure and a cross-section of the three types of devices/technologies, respectively, after a second gate oxidation and deposition of a second poly-Si layer, and subsequent resist patterning.
Figure 12B:
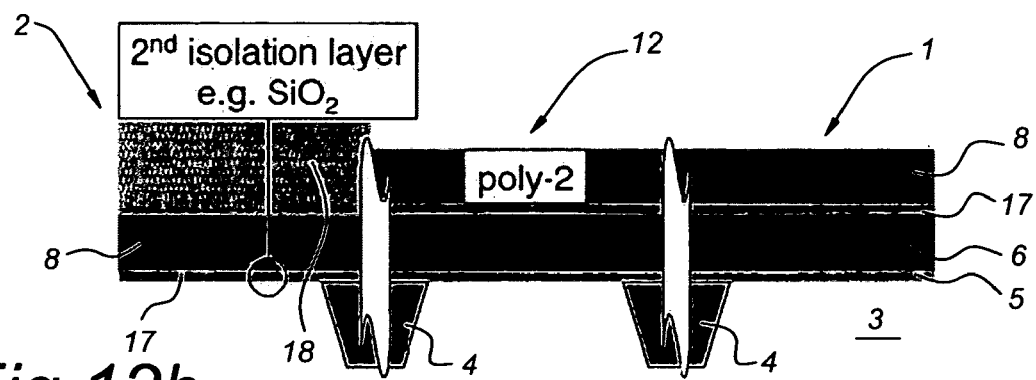

FIGS. 12a and 12b show schematically the dummy structure 26 and a cross-section of the three types of the devices/technologies, respectively, after a second gate oxidation and deposition of a second poly-Si layer, and subsequent resist patterning.

On top of the open area of block 2, and on top of the first poly-Si layer 6, a second isolation layer 17 is deposited. (In a preceding step the first gate oxidation layer 5 has been removed in the area of block 2 by any method known in the art.) This second isolation layer 17 may be e.g., a SiO$_2$ layer.

In a subsequent deposition, a second poly-Si layer 8 is deposited on top of the second isolation layer 17 over blocks 1, 2, 12 and dummy structure 26.

Next, a resist layer 18 is deposited on the second poly-Si layer 8. By means of a photolithographic step, the resist layer 18 is patterned in order to cover the entire area of block 2 and a part of the area of dummy structure 26.

The open area of dummy structure 26 is chosen in such a way that in a further RIE process a reliable and accurate end-point detection of the etching process of the second poly-Si layer 8 in block 12 and block 1 is obtained.

FIGS. 13a and 13b show schematically the dummy structure 26 and a cross-section of the three types of devices/technologies, respectively, after patterning of the second poly-Si layer 8 by a RIE process.

After etching by the RIE process as described with reference to FIGS. 12a and 12b, the second poly-Si layer 8 on the area of block 12 and on the area of block 1 has been removed. Due to the accuracy of the end-point detection, an etch-stop at the second isolation layer 17 in the areas of block 1 and 12 has been obtained. On the dummy structure 26, the exposed portion of second poly-Si layer 8 has been removed as well. The second isolation layer 17 acts as an etch-stop in this particular area on the dummy structure 26.

On the dummy structure 26, poly-Si spacers 19 may be formed on the edges of blocks consisting of the first poly-Si layer 6. The actual shape of such poly-Si spacers 19 depends, inter alia, on the actual parameters of the applied RIE process, as will be known to persons skilled in the art. On block 2 and on dummy structure 26, (part of) the second poly-Si layer 8 is still present.

FIGS. 14a and 14b show schematically the dummy structure 26 and a cross-section of the three types of devices/technologies, respectively, after deposition of a second inter-poly dielectric layer 20 and fabrication of a resist pattern 21.

The second isolation layer 17 is removed by a selective process, causing all poly-silicon areas 6, 8 to be exposed. In a subsequent step, an inter-poly dielectric layer 20 is selectively deposited on the exposed poly-silicon areas 6, 8 in blocks 1, 2, 12 and on dummy structure 26.

The second inter-poly dielectric layer 20 may be a SiO$_2$ layer or an ON or ONO layer.

Next, the wafer is spin-coated with a resist layer 21, which is patterned in such a way that the resist layer 21 over block 12 is removed.

FIGS. 15a and 15b show schematically the dummy structure 26 and a cross-section of the three types of devices/technologies, respectively, after reactive ion etching of the inter-poly dielectric layer 20 and poly-Si layer 6.

In order to form the second option technology in block 12, the first poly-Si layer 6 and the second inter-poly dielectric layer 20 in the area of block 12 have been removed by the RIE process. A resist stripping process has been applied to remove the resist layer 21.

FIGS. 16a and 16b show schematically the dummy structure 26 and a cross-section of the three types of devices/technologies, respectively after deposition of a third poly-Si layer 22 and fabrication of a resist pattern 23.

On top of the structures 1, 2, 12 and 26 as shown in FIGS. 15a and 15b, a third gate oxidation layer 31 and a third poly-Si layer 22 is deposited. The third gate oxidation layer 31 consists of e.g., SiO$_2$. In the option technology block 2 the third gate oxidation layer 31 is formed on the inter-poly dielectric layer 20. Depending on the actual formation process, the thickness and composition of the inter-poly dielectric layer 20 may still be intact after the formation of the third gate oxidation layer 31.

Next, a resist layer 23 is applied to the semiconductor wafer and patterned to define a further structure in block 2.

Also the resist layer 23 on the dummy structure 26 is opened to expose an additional area 32 consisting of poly-Si layer 22. In this manner, the poly Si-area that will be exposed in a subsequent RIE process is large enough to avoid the above-described drawbacks for RIE processing of relatively small areas.

Due to the addition of the open area 32 in dummy structure 26 to the area of the structure in block 2, the RIE process works out well and a reliable and accurate end-point detection is possible.

FIGS. 17a and 17b show schematically the dummy structure 26 and a cross-section of the three types of devices/technologies, respectively, after patterning a double poly-Si structure in a first option technology and fabrication of a resist pattern.

In FIGS. 17a and 17b the structure in block 1, 2, 12 and the dummy structure 26 are shown after the RIE process of the structure shown in FIGS. 16a and 16b. In block 2 a double poly-Si structure is formed. In dummy structure 26 an opening 28 to the second gate oxidation layer 17 is created.

For further processing a resist pattern 27 is defined on the wafer. Resist layer 27 is applied and patterned as shown. In block 2 the double poly-Si structure 8, 20, 22 is covered by the resist layer 27. In block 12 resist layer 27 is patterned to form a structure in the third poly Si-layer 22. On dummy structure 26, the resist layer 27 covers a part of the structure to reduce the area of block 12 and the area of block 1 in which the third poly-Si layer 22 is to be etched. This step is carried out if the actual area exposed to the RIE process exceeds an upper limit of, say, 90% of the wafer area.

In a subsequent RIE process the third poly-Si layer 22 is removed. Due to the reliable end-point detection provided by the reduction of poly-Si area 22, the RIE process can be controlled precisely, and an accurate etch-stop can be obtained in both blocks 1 and 12, since the thickness of the second poly-Si layer 22 is substantially equal in blocks 1 and 12. The resulting structure, obtained by the RIE process, is shown in FIGS. 18a and 18b.

FIGS. 18a and 18b show schematically the dummy structure 26 and a cross-section of the three types of devices/technologies, respectively, after patterning a single poly-Si structure in a second option technology and defining a resist pattern 29.

In the step of the process shown in FIGS. 18a and 18b, the structure of the baseline technology in block 1 is defined. For this purpose a resist layer 29 is applied to the wafer, and patterned, as shown in FIGS. 18a and 18b, so as to obtain open areas in block 1 and open areas in dummy structure 26. The open areas in dummy structure 26 serve to decrease the open area in block 1 in such a way that the RIE process which is to be applied can be accurately controlled.

FIGS. 19a and 19b show schematically the dummy structure 26 and the final cross-section of the three types of devices/technologies, respectively, after patterning a baseline structure.

After patterning a baseline device in block 1, the formation of the baseline technology and the two option technologies in block 2 and block 12 is completed. In subsequent steps, a silicide, protective isolation layer such as an inter-layer dielectric (ILD) and/or an intermetal dielectric (IMD) may be deposited, and contacts and interconnects may be created (none of which is shown).

In the schematic cross-section of FIGS. 19a and 19b, the option technology of block 2 consists of a double poly-Si device 8, 20, 22 on top of the second gate oxide 17. The option technology in block 12 consists of a single poly-Si device 22 on top of the third gate oxide 31, and the baseline technology in block 1 consists of a single poly Si-device 6 on top of the first gate oxide 5. It is noted here that the respective thickness of each of the first, second and third gate oxide layer 5, 17, 31 may be adjusted to meet the specific electronic requirements of the respective option technology blocks 1,2, 12.

In order to compensate for the relatively small area of block 2 and block 12 in comparison to block 1, the dummy structure 26 has provided sacrificial poly-Si areas to allow accurate and reliable processing by RIE.

FIGS. 20a and 20b show schematically a top view of, respectively single dummy structure 26 and multiple dummy structures 26.

The dummy structure 26 may be formed in various shapes, but preferably it is rectangular or square. By way of example, in FIGS. 20a and 20b, the dummy structure 26 is square in shape.

In the top view of the dummy structure 26 are shown: the first isolation layer 5, the first poly-Si layer 6, the third poly Si-layer 22 and the open area 28. Dotted lines in the dummy structures of FIGS. 20a and 20b demarcate the underlying structures as shown in the cross-section of dummy structure 26 in FIGS. 19a and 19b. The actual area size of each of the components 6, 8, 19, 22, 5, 17, 20, 31 in the dummy structure 26 depends on the processing steps to define the baseline and option technologies in the system-on-chip, on the relative area size of each of these technologies, and on the relative sizes of each of the constituent parts of each technology. It will thus be appreciated that the actual form of the dummy structure 26 will depend on the device structures in blocks 1, 2 and 12, and the ratio of the actual area occupied by these device structures in these blocks over the total area of the substrate 3.

Also, since the dummy structure 26 is used as an area-compensation in RIE processes, the area of the dummy structure 26 may be represented by a single area, as shown in FIG. 20a, but optionally it may also be divided into a plurality of smaller dummy structures 26, as shown in FIG. 20b. With such a plurality of dummy structures 26, the dummy structures 26 may have various sizes and can be placed on any available area on the wafer.

Dummy structures 26 may be located at several locations available on the semiconductor wafer. The dummy structure 26 may be located close to a single system-on-chip; it may also be located in specifically designated areas of the semiconductor wafer, spaced apart from the actual die comprising the system-on-chip. The dummy structure 26 may also be merged into the system-on-chip area. Especially when a plurality of dummy structures 26 of various sizes are applied, a distribution can be made in which, for example, small-sized dummies are located within the chip area, and larger-sized dummies are located at the periphery of the chip area or at some other locations on the semiconductor wafer.

It is noted that the dummy structure 25; 26 according to the present invention may comprise option technologies other than bipolar, non-volatile or analog. Also, the present invention is not restricted to the use of polysilicon layers to form devices; i.e. in the option technology materials other than polysilicon, such as for instance amorphous Si, Si—Ge, III-V compounds, and metals (e.g. Al, W, Cu, Ti, etc.), may be applied. Therefore, the dummy structure 25; 26 may also comprise various subtypes which may be designed specifically for an option technology or for a specific processing step during manufacturing.

The invention claimed is:

1. A method of manufacturing a semiconductor device on a semiconductor substrate, comprising a first electronic circuit in a baseline technology and at least a second electronic circuit in a first option technology, said first and second electronic circuits being functional parts of a system-on-chip, said method comprising the steps of:
    manufacturing said first electronic circuit with at least a first conductive layer that is patterned by subjecting an exposed portion of said first conductive layer to Reactive Ion Etching;
    manufacturing said second electronic circuit with at least a second conductive layer that is patterned by subjecting an exposed portion of said at least second conductive layer to Reactive Ion Etching;
    providing at least one dummy structure;
wherein the method further comprises the following steps:
    providing said at least one dummy structure with at least one dummy conductive layer produced in the same processing step as one of said at least second conductive layer; and
    exposing at least a portion of said at least one dummy conductive layer to obtain an exposed portion of said at least one dummy conductive layer, and Reactive Ion Etching of said exposed portion of said at least one dummy conductive layer too when said one of said at least second conductive layer is subjected to Reactive Ion Etching.

2. The method of manufacturing a semiconductor device on a semiconductor substrate, according to claim 1, said method further comprising the steps of:
    manufacturing said second electronic circuit with at least a third conductive layer on said at least second conductive layer, which is patterned by subjecting an exposed portion of said at least third conductive layer to Reactive Ion Etching;
wherein the method further comprises the following steps:
    providing said at least one dummy structure with at least one dummy conductive layer produced in the same processing step as one of said at least second and at least third conductive layers; and
    exposing at least a portion of said at least one dummy conductive layer to obtain an exposed portion of said at least one dummy conductive layer, and Reactive Ion Etching of said exposed portion of said at least one dummy conductive layer too when said one of said at least second and third conductive layers is subjected to Reactive Ion Etching.

3. The method of manufacturing a semiconductor device on a semiconductor substrate, according to claim 2, characterized in that said at least third conductive layer is separated from said at least second conductive layer by a dielectric layer.

4. The method according to claim 1, performed on a predetermined substrate area, wherein said second electronic circuit covers less than 10% of said predetermined substrate area.

5. The method according to claim 1, wherein said dummy structure comprises a first dummy conductive layer and a second dummy conductive layer, and the method further includes the following steps:
    exposing at least a portion of said first dummy conductive layer to obtain a first exposed portion of said first dummy conductive layer, and Reactive Ion Etching of said first exposed portion too when said second conductive layer is subjected to Reactive Ion Etching; and
    exposing at least a portion of said second dummy conductive layer to obtain a second exposed portion of said second dummy conductive layer, and Reactive Ion Etching of said second exposed portion too when said third conductive layer is subjected to Reactive Ion Etching.

6. The method according to claim 3 wherein said method comprises the steps of:
    providing said dummy structure with a lower and an upper dummy conductive layers produced in the same processing steps as said second and said third conductive layers, respectively; and
    exposing at least a portion of said upper dummy conductive layer to obtain an exposed portion of said upper dummy conductive layer, and Reactive Ion Etching of said exposed portion of said upper dummy conductive layer and said lower dummy conductive layer below said exposed portion of said upper dummy conductive layer too when said second and third conductive layers are subjected to Reactive Ion Etching.

7. The method of manufacturing a semiconductor device on a semiconductor substrate, according to claim 6, characterized in that in said dummy structure said lower and said upper dummy conductive layer are separated by an inter-poly dielectric layer.

8. The method according to claim 6, wherein said semiconductor substrate also comprises at least a third electronic circuit in a second option technology, said at least third electronic circuit having at least a fourth conductive layer produced in the same processing step as said at least one dummy conductive layer, said at least third electronic circuit being a further functional part of said system-on-chip, the method comprising the step of Reactive Ion Etching of at least part of said fourth conductive layer when said at least one dummy conductive layer is subjected to Reactive Ion Etching.

9. The method according to claim 8, characterized in that any of said first, second, third and fourth conductive layer is either a polysilicon layer, an amorphous silicon layer, a silicon-germanium layer, a germanium layer or a metallic layer.

10. A method of manufacturing a semiconductor device on a semiconductor substrate, comprising a first electronic circuit in a baseline technology, a second electronic circuit in a first option technology and at least a third electronic circuit in a second option technology, said first, second and third electronic circuits being fractional parts of a system-on-chip, said method comprising the steps of:
    manufacturing said first electronic circuit with at least a first conductive layer that is patterned by subjecting an exposed portion of said first conductive layer to Reactive Ion Etching;
    manufacturing said second electronic circuit with at least a second conductive layer that is patterned by subjecting an exposed portion of said second conductive layer to Reactive Ion Etching;
    manufacturing said third electronic circuit with at least a third conductive layer that is patterned by subjecting an exposed portion of said third conductive layer to Reactive Ion Etching;
    providing at least one dummy structure;
wherein the method further comprises the following steps:
    providing said at least one dummy structure with at least one dummy conductive layer produced in the same processing step as one of said at least second conductive layers and as one of at least third conductive layers; and exposing at least a portion of said at least one dummy conductive layer to obtain an exposed portion of said at least one dummy conductive layer, and Reactive Ion Etching of said exposed portion of said at least one dummy conductive layer too when said one of said at least second conductive layers and one of said at least third conductive layers are subjected to Reactive Ion Etching.

11. The method according to claim 10, characterized in that any of said first, second, and third conductive layer is either a polysilicon layer, an amorphous silicon layer, a silicon-germanium layer, a germanium layer or a metallic layer.

* * * * *